(12) United States Patent
Watanabe et al.

(10) Patent No.: US 11,715,657 B2
(45) Date of Patent: Aug. 1, 2023

(54) SUBSTRATE MISALIGNMENT DETECTION METHOD, SUBSTRATE POSITION ABNORMALITY DETERMINATION METHOD, SUBSTRATE TRANSFER CONTROL METHOD, AND SUBSTRATE MISALIGNMENT DETECTION DEVICE

(71) Applicant: Tokyo Electron Limited, Tokyo (JP)

(72) Inventors: Shinjiro Watanabe, Nirasaki (JP); Koji Aramaki, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 377 days.

(21) Appl. No.: 17/141,830

(22) Filed: Jan. 5, 2021

(65) Prior Publication Data
US 2021/0210366 A1    Jul. 8, 2021

(30) Foreign Application Priority Data
Jan. 7, 2020 (JP) ................... 2020-000894

(51) Int. Cl.
*H01L 21/683* (2006.01)
*H01L 21/67* (2006.01)
*G06T 7/00* (2017.01)
*H01L 21/677* (2006.01)
*H01L 21/66* (2006.01)

(52) U.S. Cl.
CPC ........ *H01L 21/67259* (2013.01); *G06T 7/001* (2013.01); *H01L 21/67742* (2013.01); *H01L 21/6838* (2013.01); *H01L 22/12* (2013.01); *G06T 2207/30148* (2013.01)

(58) Field of Classification Search
CPC .................. H01L 21/682; H01L 21/68; G06T 2207/30148; G06T 7/0004; G01B 11/27; G01B 11/272; G01B 11/11; G01N 21/9501; G01R 31/2865
USPC ...... 356/237.1–237.5, 399–401; 324/762.05, 324/750.16, 757.03, 750.19, 756.04
See application file for complete search history.

(56) References Cited

U.S. PATENT DOCUMENTS 5,604,443 A * 2/1997 Kitamura ........... G01R 31/2831
  414/940
5,999,268 A * 12/1999 Yonezawa .......... G01R 31/2887
  324/750.19
(Continued)

FOREIGN PATENT DOCUMENTS

JP    2018-195644 A    12/2018
KR    1020110044328 A    4/2011

*Primary Examiner* — Hoa Q Pham
(74) *Attorney, Agent, or Firm* — Nath, Goldberg & Meyer; Jerald L. Meyer; Tanya E. Harkins

(57) ABSTRACT

A substrate misalignment detection method includes: acquiring first image information or first position information of a substrate held to a stage by suction at a first height position; delivering the substrate from the stage to a holder in a state in which the suction of the substrate is released and causing the holder to hold the substrate at the first height position; acquiring second image information or second position information of the substrate held at the first height position; and detecting misalignment of the substrate by comparing the first image information with the second image information or by comparing the first position information with the second position information.

18 Claims, 8 Drawing Sheets

(56) References Cited

U.S. PATENT DOCUMENTS

| | | | |
|---|---|---|---|
| 7,417,445 B2* | 8/2008 | Sakagawa | G01R 31/2851 324/754.03 |
| 7,925,363 B2* | 4/2011 | Yamamoto | G05B 23/027 715/272 |
| 2005/0018168 A1* | 1/2005 | Akutsu | G03F 7/70708 355/75 |
| 2011/0018564 A1* | 1/2011 | Washio | G01R 31/2891 324/750.16 |
| 2013/0241588 A1* | 9/2013 | Yamada | G01R 31/2891 324/750.24 |
| 2021/0215742 A1* | 7/2021 | Saiki | H01L 21/67103 |

* cited by examiner

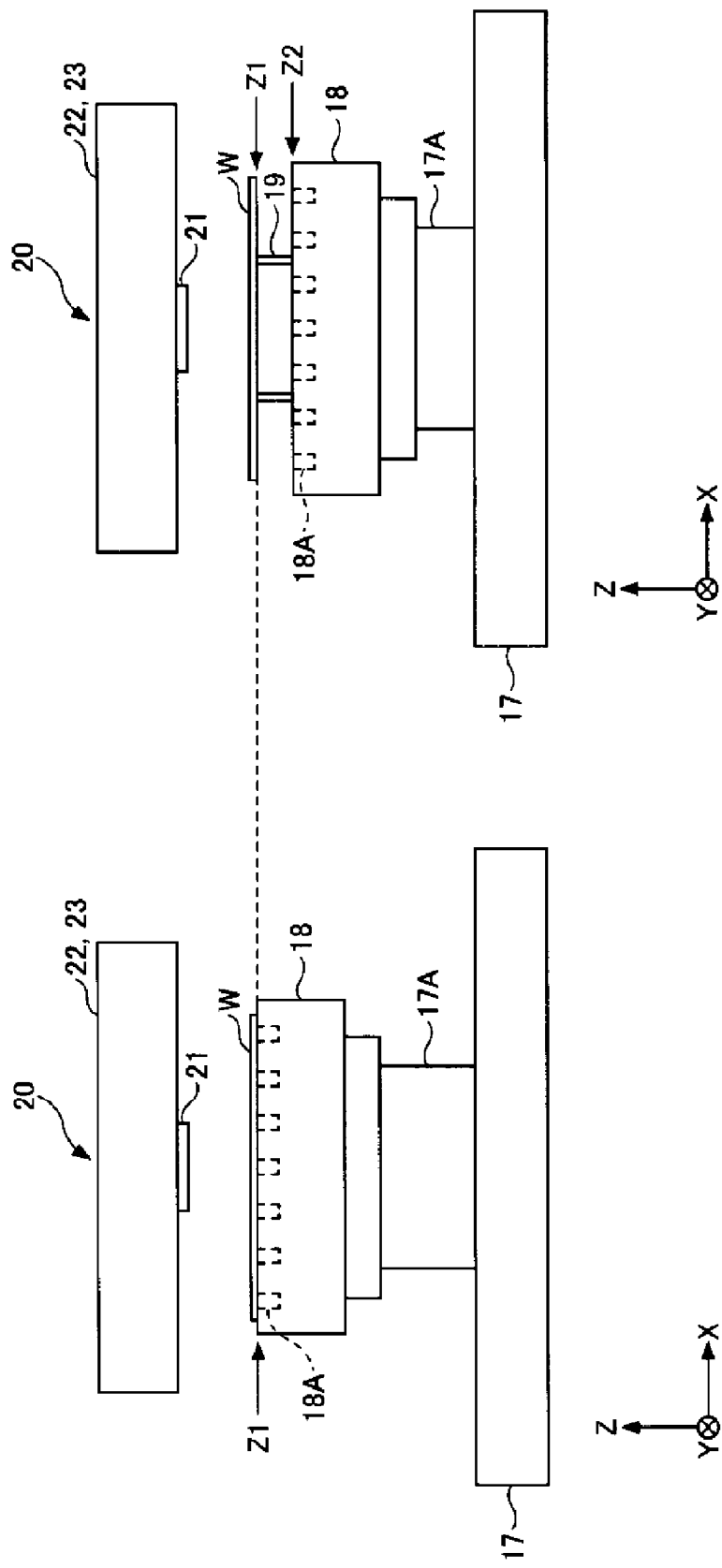

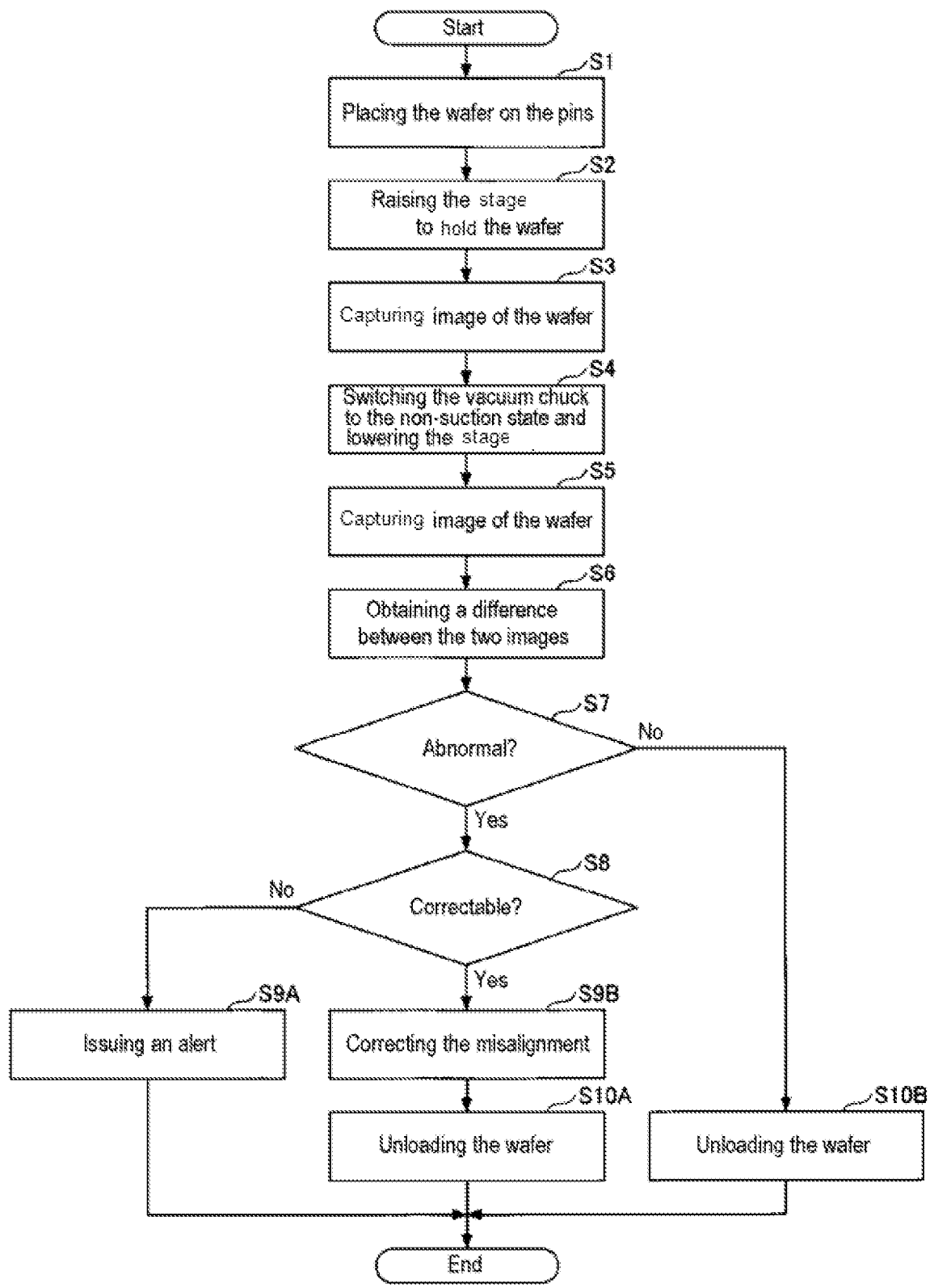

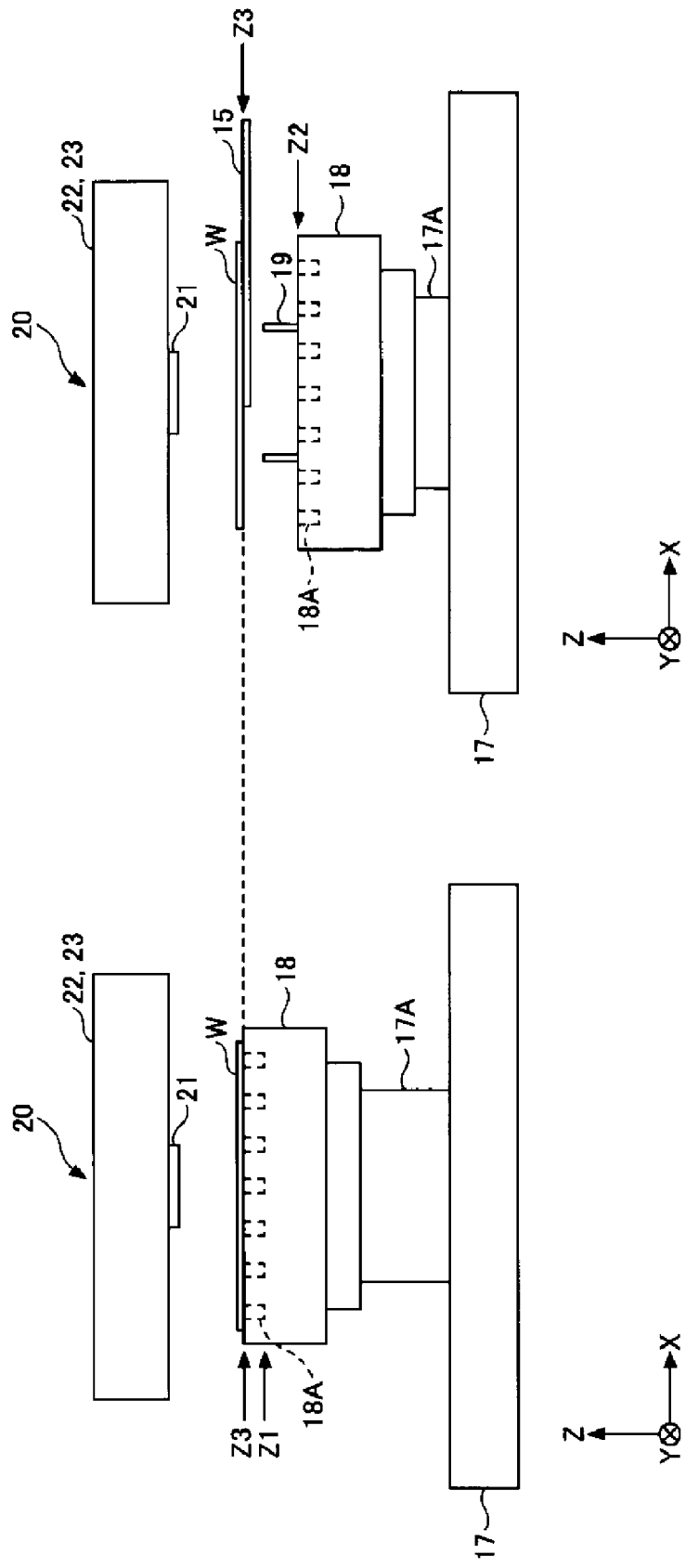

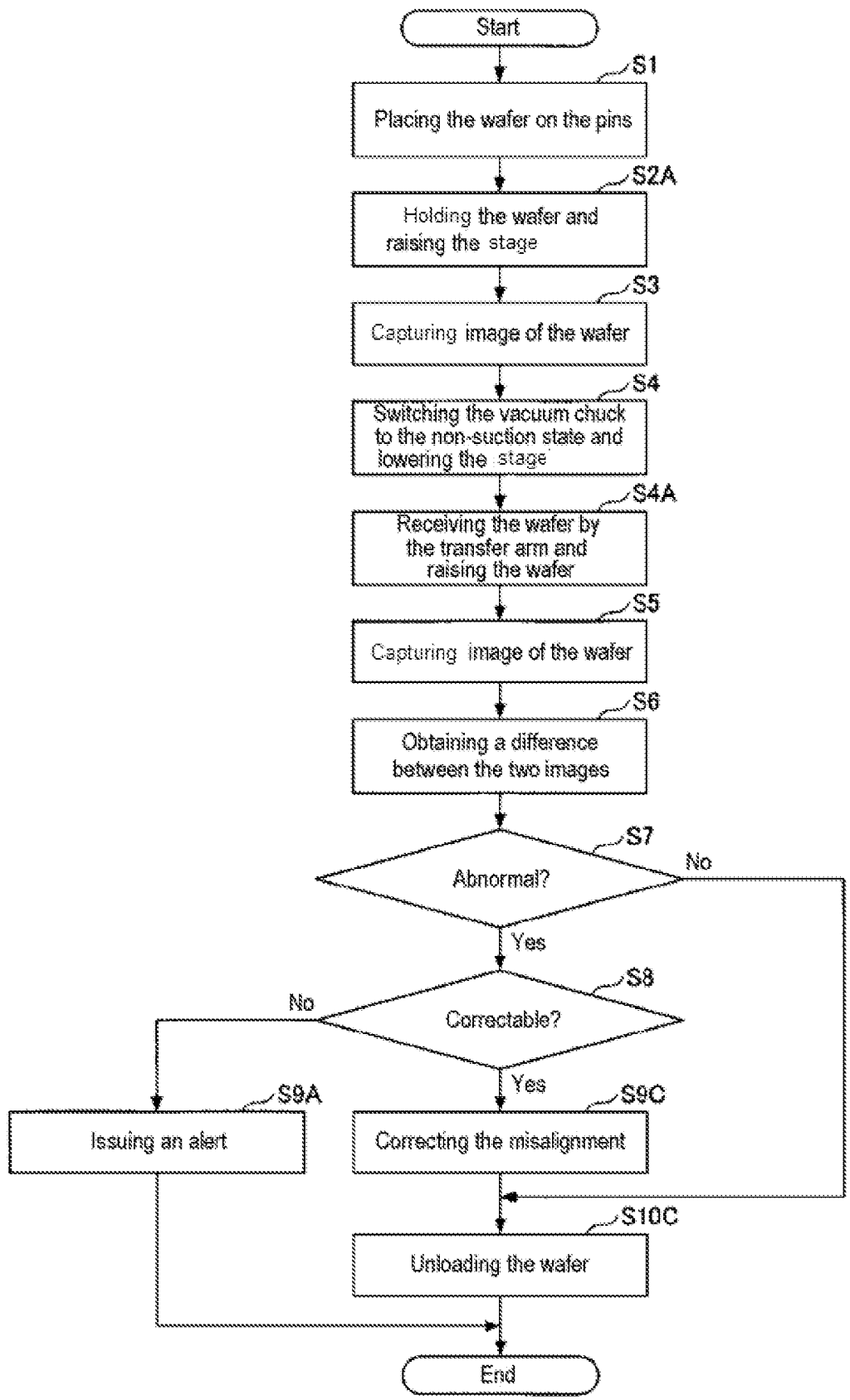

SUBSTRATE MISALIGNMENT DETECTION METHOD, SUBSTRATE POSITION ABNORMALITY DETERMINATION METHOD, SUBSTRATE TRANSFER CONTROL METHOD, AND SUBSTRATE MISALIGNMENT DETECTION DEVICE

CROSS-REFERENCE TO RELATED APPLICATION

This application is based upon and claims the benefit of priority from Japanese Patent Application No. 2020-000894, filed on Jan. 7, 2020, the entire contents of which are incorporated herein by reference.

TECHNICAL FIELD

The present disclosure relates to a substrate misalignment detection method, a substrate position abnormality determination method, a substrate transfer control method, and a substrate misalignment detection device.

BACKGROUND

Patent Document 1 discloses a technique in which misalignment and/or tilt of a substrate lifted up by pins protruding from a stage is detected based on an image obtained by imaging the peripheral edge portion of the substrate lifted up by the pins while a transfer mechanism is moving to the stage.

PRIOR ART DOCUMENT

Patent Document

Patent Document 1: Japanese laid-open publication No. 2018-195644

SUMMARY

According to one embodiment of the present disclosure, there is provided a substrate misalignment detection method which includes: acquiring first image information or first position information of a substrate held to a stage by suction at a first height position; delivering the substrate from the stage to a holder in a state in which the suction of the substrate is released and causing the holder to hold the substrate at the first height position; acquiring second image information or second position information of the substrate held at the first height position; and detecting misalignment of the substrate by comparing the first image information with the second image information or by comparing the first position information with the second position information.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A and 3B are diagrams showing examples of a positional relationship between a stage and pins when an image of a wafer is acquired in the first embodiment.

FIG. 5 is a flowchart showing an example of the processing performed by a substrate misalignment detection method, a substrate position abnormality determination method and a substrate transfer control method according to the first embodiment.

FIGS. 6A and 6B are diagrams showing examples of a positional relationship between a stage and pins when an image of a wafer is acquired in a second embodiment.

FIG. 7 is a flowchart showing an example of the processing performed by a substrate misalignment detection method, a substrate position abnormality determination method and a substrate transfer control method according to the second embodiment.

DETAILED DESCRIPTION

Figure 1:
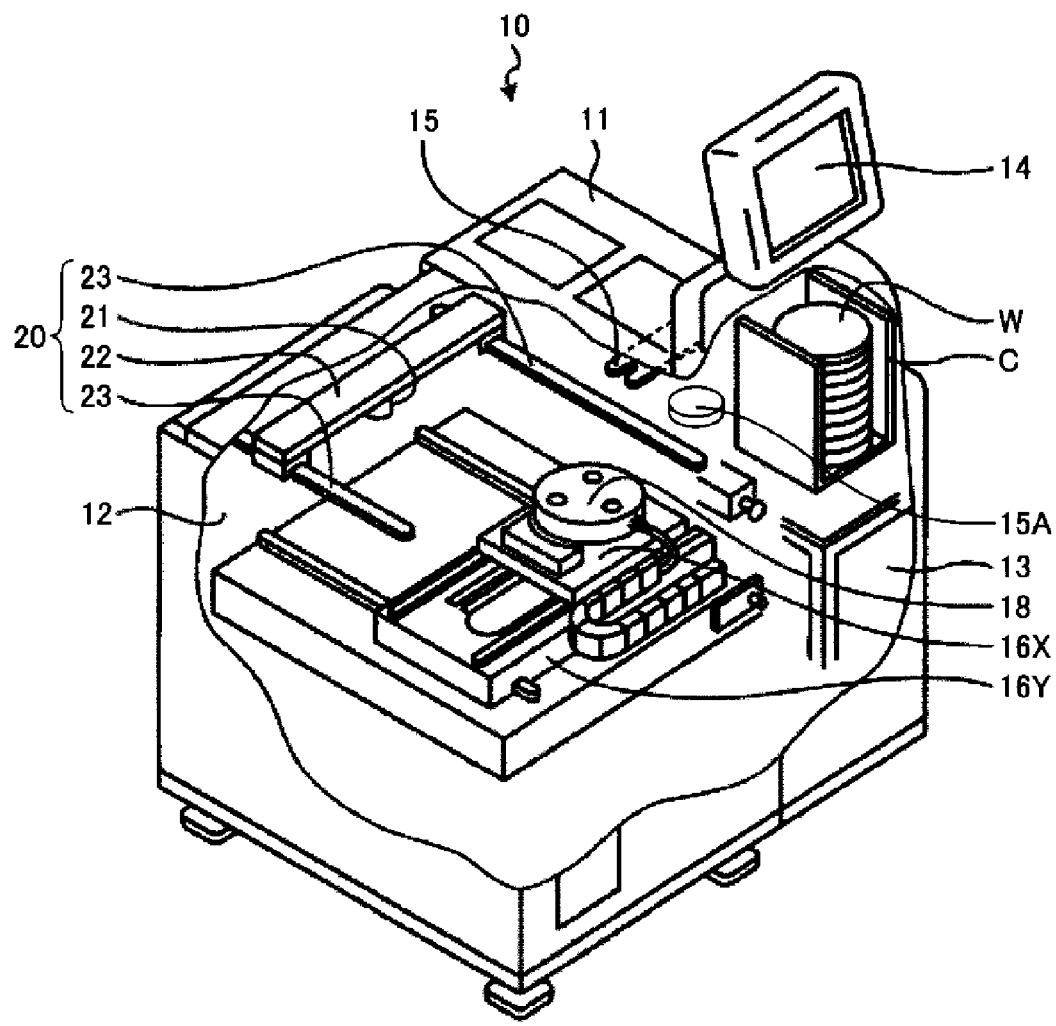
FIG. 1 is a perspective view showing an example of an inspection device according to a first embodiment.

Hereinafter, embodiments for carrying out the present disclosure will be described with reference to the figures. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the subject specification and the figures, substantially the same configurations will be designated by the same reference numerals, and the duplicate description thereof will be omitted in some cases. In the following, the description will be made using a vertical direction or a vertical relationship in the figures, which do not represent the universal vertical direction or the universal vertical relationship.

First Embodiment

FIG. 1 is a perspective view showing an example of an inspection device 10 according to a first embodiment. In FIG. 1, for the sake of convenience in description, the inspection device 10 is shown to be partially cut out. As shown in FIG. 1, the inspection device 10 includes a loader room 11, a prober room 12, a controller 13 and a display device 14.

The loader room 11 includes a transfer arm 15 which is an example of a transfer mechanism. The transfer arm 15 loads a semiconductor wafer (hereinafter referred to as "wafer") W, which is a substrate accommodated in a cassette C, into the prober room 12. Furthermore, the transfer arm 15 unloads the inspected wafer W from the prober room 12 to a predetermined unloading position.

The prober room 12 inspects electrical characteristics of the wafer W loaded by the transfer arm 15. In the prober room 12, there are provided an X stage 16X and a Y stage 16Y that move the stage 18 in the vertical direction (the Z-axis direction in FIG. 1) and the horizontal direction (the direction in the XY plane parallel to the X and Y axes in FIG. 1), and the like. The wafer W loaded by the transfer arm 15 is placed on the stage 18. The stage 18 sucks and holds the placed wafer W on the upper surface of the stage 18 by vacuum suction or the like.

Figure 2:
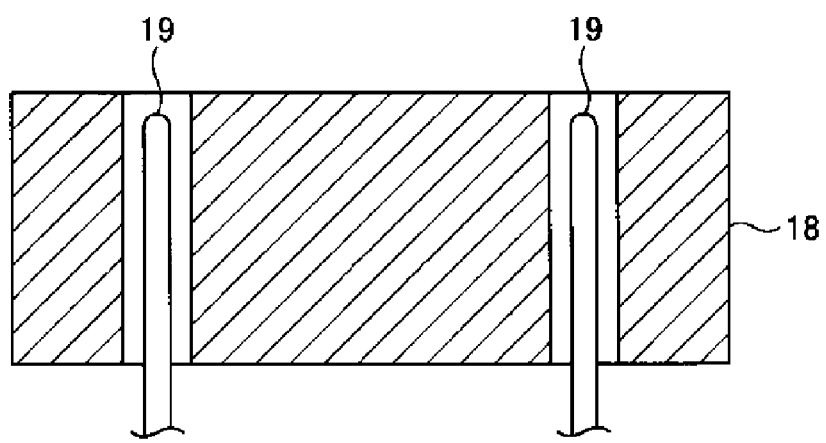
FIG. 2 is a sectional view showing an example of a stage in the present embodiment.

FIG. 2 is a sectional view showing an example of the stage 18 in the present embodiment. As shown in FIG. 2, the stage 18 is provided with pins 19 that are moved up and down by a drive mechanism (not shown) and can move upward and downward on the stage 18. The pins 19 temporarily protrude from the stage 18 and support the wafer W above the stage 18 when the wafer W is loaded onto the stage 18 and when the wafer W is unloaded from the stage 18. Three pins 19 may be provided as an example.

Referring back to FIG. 1, an alignment device 20 and a probe card (not shown) are provided in the prober room 12. The alignment device 20 is an optical bridge alignment device for aligning the wafer W placed on the stage 18 at the predetermined inspection position. The alignment device 20 includes a camera 21, an alignment bridge 22, and a pair of linear guides 23 and 23. The camera 21 is mounted on the alignment bridge 22 so that an imaging direction faces downward. The alignment bridge 22 is supported by the pair of linear guides 23 and 23 so as to be movable in the Y-axis direction. The alignment bridge 22 is connected to a movement mechanism (not shown) which is configured to move the alignment bridge 22 in the Y-axis direction. As the alignment bridge 22 is moved in the Y-axis direction by the movement mechanism, the camera 21 mounted on the alignment bridge 22 is also moved in the Y-axis direction. The movement mechanism is controlled by the controller 13. A movement amount of the camera 21 and the alignment bridge 22 is controlled by the controller 13.

When the wafer W placed on the stage 18 is aligned, the alignment bridge 22 is moved from a standby position in the Y-axis direction along the pair of linear guides 23 and 23 by the movement mechanism (not shown). As the alignment bridge 22 moves in the Y-axis direction, the camera 21 mounted on the alignment bridge 22 also moves in the Y-axis direction and reaches a preset alignment position below the probe card. In this state, the wafer W on the stage 18 is aligned in cooperation between the camera 21 mounted on the alignment bridge 22 and a camera (not shown) fixed to the side of the stage 18. Thereafter, the alignment bridge 22 is returned to the original standby position by the movement mechanism (not shown). Further, a pre-alignment device 15A is provided in the prober room 12. The pre-alignment device 15A is an example of a correction device, and is provided near the cassette C as an example. The pre-alignment device 15A includes a disk-shaped rotating body on which the wafer W can be placed, and can correct misalignment by rotating the placed wafer W by the transfer arm 15 on the XY plane. The misalignment of the wafer W that can be corrected by the pre-alignment device 15A is a misalignment of the center position of the wafer W or a misalignment of the rotation direction angle on the XY plane, which is a relatively slight misalignment. Although an aspect in which the pre-alignment device 15A is used as the correction device will be described here, it may be possible to use a device other than the pre-alignment device 15A.

Further, the probe card has probe needles for inspecting the electrical characteristics of the wafer W aligned by the alignment device 20. The probe card is fixed via an insert ring to a central opening portion of a head plate that can be opened and closed with respect to the upper surface of the prober room 12. In addition, a test head (not shown) is rotatably arranged in the prober room 12.

When the wafer W placed on the stage 18 is inspected, first, the probe card and a tester (not shown) are electrically connected to each other via the test head. Then, a predetermined signal is outputted from the tester to the wafer W on the stage 18 via the probe card, and a response signal is outputted from the wafer W to the tester via the probe card. As a result, the electrical characteristics of the wafer W are evaluated by the tester. Then, after the inspection of the electrical characteristics of the wafer W is completed, the pins 19 protrude from the stage 18 whereby the wafer W is lifted up by the pins 19. Then, the wafer W lifted up by the pins 19 is delivered to the transfer arm 15 that has moved to the stage 18, and is unloaded to a predetermined unloading position by the transfer arm 15.

The operations of the inspection device 10 having the above configuration are collectively controlled by the controller 13. The controller 13 includes a data processing part composed of a program, a memory and a CPU (Central Processing Unit), and the like. The program is configured to send a control signal from the controller 13 to each part of the inspection device 10, carry out various steps described in detail later, and unload the wafer W. Furthermore, for example, the memory has an area in which the values of various parameters are written. When the CPU executes each instruction of the program, the processing parameter is read out and the control signal corresponding to the value of the processing parameter value is sent to each part of the inspection device 10. This program (including a program related to the input operation and display of the processing parameter) is stored in a non-transitory computer-readable storage medium, for example, a memory part such as a flexible disk, a compact disk, or an MO (magneto-optical disk) or the like and is installed on the controller 13.

For example, the controller 13 controls each part of the inspection device 10. Taking one specific example, while a command to start unloading the wafer W placed on the stage 18 is issued to the transfer arm 15 and the transfer arm 15 is moving to the stage 18, the controller 13 causes the camera 21 to move to above a predetermined region where the peripheral edge portion of the wafer W should exist, in a state in which the wafer W is lifted up by the pins 19 protruding from the stage 18. Then, the controller 13 causes the moved camera 21 to capture an image of the area to be captured. Then, the controller 13 detects the misalignment of the wafer W lifted up by the pins 19 based on the image taken by the camera 21. In this regard, the misalignment of the wafer W lifted up by the pins 19 includes planar misalignment available in a state in which the wafer W is lifted up by the three pins 19 when the heights of the three pins 19 are not deviated from each other, and misalignment available when the heights of the three pins 19 are deviated from each other and the wafer W is tilted. In addition, the controller 13 performs the control as described below.

FIGS. 3A and 3B are diagrams showing examples of a positional relationship between the stage 18 and the pins 19 when the image of the wafer W is acquired in the first embodiment. FIGS. 3A and 3B show the stage 18, the pins 19 and the surroundings thereof on an enlarged scale. Further, suction grooves 18A for vacuum chuck of the stage 18 are shown in a simplified manner. The stage 18 is provided with a vacuum chuck that sucks the wafer W through the suction grooves 18A and sucks the wafer W onto the upper surface of the stage 18 in a state in which the wafer W is placed on the stage 18. An operation state of the vacuum chuck is controlled by the controller 13 so that the suction/non-suction state of the wafer W is switched.

FIGS. 3A and 3B show a stage base 17, an elevating mechanism 17A, the pins 19, and the alignment device 20 in addition to the stage 18, and omit other components of the inspection device 10 (see FIG. 1). Further, FIGS. 3A and 3B show states in which the height positions (positions in the height direction) of the elevating mechanism 17A and the pins 19 are different. As for the alignment device 20, the position of the camera 21 is shown in a state in which the alignment bridge 22 and the linear guides 23 are simplified.

The stage base 17 is a base of the inspection device 10 (see FIG. 1) provided with the X stage 16X and the Y stage 16Y (see FIG. 1). In FIGS. 3A and 3B, the X stage 16X and the Y stage 16Y (see FIG. 1) are omitted, and the elevating mechanism 17A omitted in FIG. 1 is shown.

The elevating mechanism 17A holds the stage 18 so as to be vertically movable with respect to the stage base 17. The elevating mechanism 17A is controlled by the controller 13 to adjust the position of the stage 18 in the Z direction.

The pins 19 are an example of a holder, and are directly or indirectly fixed to the stage base 17. The pins 19 are accommodated in the stage 18 as shown in FIG. 3A when the stage 18 is raised by the elevating mechanism 17A. The pins 19 protrude upward from the upper surface of the stage 18 as shown in FIG. 3B when the stage 18 is lowered by the elevating mechanism 17A. In the state shown in FIG. 3A, the height positions of the upper surface of the stage 18 and the upper ends of the pins 19 are the same.

In FIG. 3A, the wafer W is held by suction to the upper surface of the stage 18 by the vacuum chuck. In this state, the wafer W is transferred by the transfer arm 15 (see FIG. 1) and is accurately placed at a correct position on the upper surface of the stage 18. Thus, the wafer W is located at a position where the electrical characteristics of the wafer W can be inspected.

When the inspection of the electrical characteristics is completed, the wafer W is held by the pins 19 as shown in FIG. 3B in order to be transferred by the transfer arm 15 (see FIG. 1). More specifically, when the stage 18 is lowered by the elevating mechanism 17A after the vacuum chuck is switched to the non-suction state in the state shown in FIG. 3A, the wafer W is delivered from the stage 18 to the pins 19. Thus, the wafer W is held by the pins 19 as shown in FIG. 3B.

In this regard, in a state in which the wafer W is placed on the upper surface of the stage 18 as shown in FIG. 3A and a state in which the wafer W is held by the pins 19 as shown in FIG. 3B, the height positions of the wafer W are the same, and the height position of the lower surface of the wafer W is $Z=Z1$ (mm) as an example. The height $Z1$ is, for example, the height of the stage 18 inside the prober room 12 with respect to a reference position in the Z direction. The reference position in the Z direction may be set to an arbitrary position of the inspection device 10, and may be set to, for example, a height position of the upper surface of the stage base 17 or the like.

The height position of the upper surface of the stage 18 shown in FIG. 3A is equal to the height position of the lower surface of the wafer W ($Z=Z1$), and is an example of a first height position. Further, the height position of the upper surface of the stage 18 shown in FIG. 3B is $Z=Z2$ (mm), and is an example of a second height portion. $Z2$ is lower than $Z1$ ($Z2<Z1$).

In this way, during the transition from the state of FIG. 3A to the state of FIG. 3B, there occur a situation where the wafer W is placed on the upper surface of the stage 18 and the vacuum chuck is switched from the suction state to the non-suction state and a situation where the state of the wafer W is switched from a state in which the wafer W is placed on the stage 18 without being held by suction to the upper surface of the stage 18 to a state in which the wafer W is held by the pins 19 (the placement position of the wafer W is changed). Therefore, there is a possibility that the wafer W may be misaligned with respect to the correct position in the state shown in FIG. 3A.

The state in which the wafer W is not held by suction by the vacuum chuck is a state in which the position of the wafer W is not fixed on the upper surface of the stage 18 and a state in which the position of the wafer W is not controlled. For example, when the state of the vacuum chuck is switched to the non-suction state, if a negative pressure remains in the suction grooves 18A, the wafer W jumps up when lowering the stage 18, whereby the misalignment of the wafer W may occur in some cases. Furthermore, for example, when the state of the vacuum chuck is switched to the non-suction state, if the time for blowing an air into the suction grooves 18A is too long, the wafer W jumps up on the stage 18, whereby the misalignment of the wafer W may occur in some cases. Although the example in which the pins 19 are directly or indirectly fixed to the stage base 17 will be described here, the pins 19 may be configured to move up and down with respect to the stage 18. In this case, the stage 18 may or may not be movable up and down. In the case where the pins 19 move up and down with respect to the stage 18 in this way, for example, when the three pins 19 move up, the heights thereof are not aligned and the wafer W is tilted, whereby the misalignment of the wafer W may occur in some cases.

As described above, in the state in which the wafer W is not held by suction by the vacuum chuck, the position of the wafer W is not fixed with respect to the stage 18. Therefore, the wafer W may be misaligned. If the misalignment of the wafer W occurs, it may affect, for example, a process of transferring the wafer W by the transfer arm 15 from the state shown in FIG. 3B.

Therefore, in the first embodiment, there is provided a technique capable of correctly detecting the misalignment of the wafer W after going through the state in which the wafer W is not held by suction by the vacuum chuck. In the first embodiment, in the state in which the wafer W is accurately arranged at the correct position on the upper surface of the stage 18 and held by suction by the vacuum chuck and in the state in which the state of the vacuum chuck is switched to the non-suction state and the wafer W is held by the pins 19, the height positions of the wafer W are aligned, images are taken by the camera 21, and the two images are compared to detect the misalignment of the wafer W.

Figure 4A:
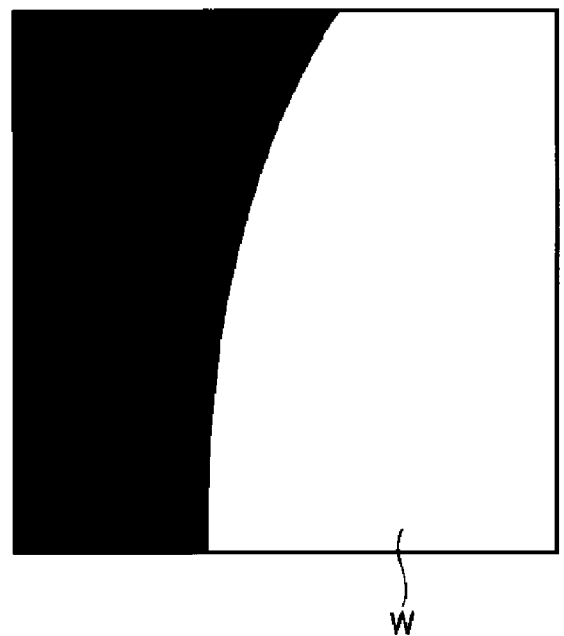
FIGS. 4A to 4C are diagrams showing examples of a method of obtaining a difference between two images.
Figure 4B:
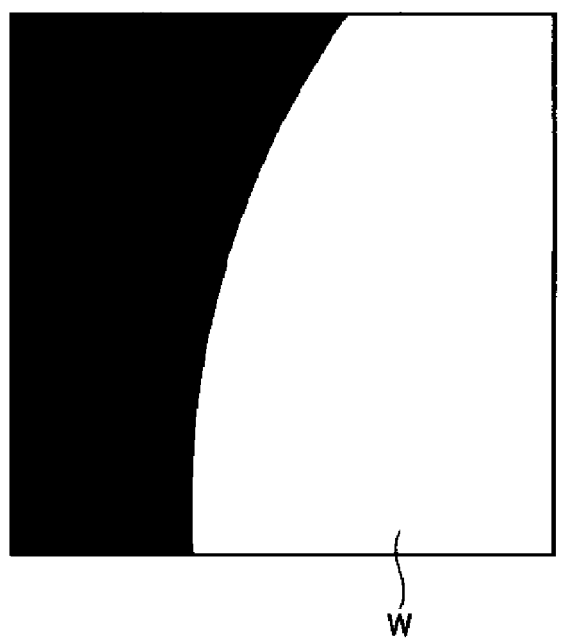
Figure 4C:
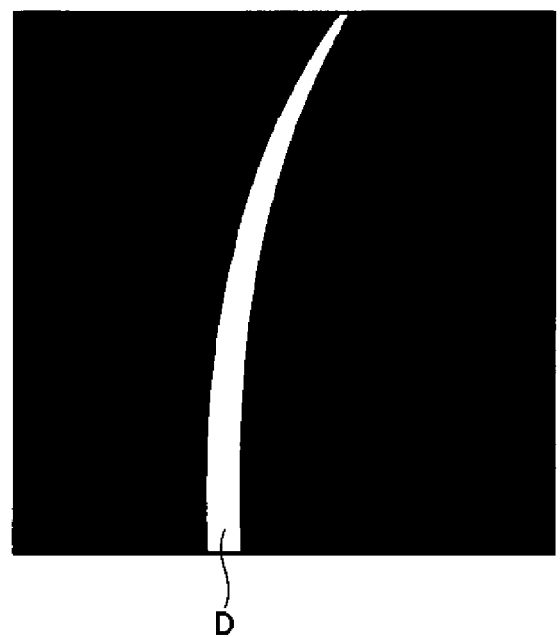

FIGS. 4A to 4C are diagrams showing examples of a method of obtaining a difference between two images. Here, as an example, there will be described the difference between the two images available in the case where the wafer W undergoes planar misalignment when the heights of the three pins 19 are not deviated from each other.

For example, it is assumed that the image shown in FIG. 4A is obtained in a state in which the wafer W is arranged at a correct position on the upper surface of the stage 18 and held by suction by the vacuum chuck (the state shown in FIG. 3A). A white portion is the wafer W and a black portion is a portion other than the wafer W.

Further, it is assumed that the image shown in FIG. 4B is obtained in a state in which the state of the vacuum chuck is switched to the non-suction state and the wafer W is held by the pins 19 (the state shown in FIG. 3B). The two images are acquired by the camera 21 at the positions where the wafer W is at the same height.

Then, it is assumed that the difference between the images shown in FIGS. 4A and 4B is as shown in FIG. 4C. In FIG. 4C, a white portion represents a difference D between the two images. Since the two images are obtained by imaging the wafer W at the same height positions with the camera 21, the difference D between the two images represents the misalignment of the wafer W. That is, the presence of the difference D in FIG. 4C indicates that the wafer W is misaligned. In the first embodiment, the misalignment of the wafer W is detected in this way. If the misalignment of the wafer W represented by the difference D is divided into components in the X and Y directions, it is possible to detect the amount of misalignment of the center of the wafer W in the X and Y directions. Further, the amount of misalignment of the wafer W on the XY plane in the rotation direction can be detected based on the position where the center of the wafer W is misaligned in the X and Y directions. Moreover, instead of obtaining the difference D, the X-direction positions of the edges (opposite ends) of the wafer W in the image shown in FIG. 4A and the image shown in FIG. 4B may be measured at two locations whose Y-direction positions are different, thereby detecting the amount of misalignment of the wafer W in the X and Y directions and the amount of misalignment of the wafer W in the rotation direction. Furthermore, the Y-direction positions of the edges (opposite ends) of the wafer W may be measured at two locations whose X-direction positions are different, thereby detecting the amount of misalignment of the wafer W in the X and Y directions and the amount of misalignment of the wafer W in the rotation direction.

The image obtained by capturing the wafer W with the camera 21 when the heights of the three pins 19 are deviated from each other and the wafer W is tilted at an angle in a state in which the state of the vacuum chuck is switched to the non-suction state and the wafer W is held by the pins 19 includes a gradation pattern in which a color tone of a portion where the wafer W is reflected is not constant and gradually changed. As a result, the difference D from the image shown in FIG. 4A and acquired in a state in which the wafer W is arranged at the correct position on the upper surface of the stage 18 and held by suction by the vacuum chuck (the state shown in FIG. 3A) also includes such a gradation pattern. Therefore, the case where the difference D includes the gradation pattern is the case where the heights of the three pins 19 are deviated from each other and the wafer W is tilted.

FIG. 5 is a flowchart showing an example of the processing performed by a substrate misalignment detection method, a substrate position abnormality determination method and a substrate transfer control method according to the first embodiment. The processing shown in FIG. 5 is executed by the controller 13.

The substrate misalignment detection method of the first embodiment is implemented by the processing of steps S1 to S6 among steps S1 to S10B described below. Furthermore, the device (controller 13) that implements the substrate misalignment detection method is a substrate misalignment detection device.

Further, the substrate position abnormality determination method of the first embodiment is implemented by the processing in which the processing of step S7 or the processing of steps S7 and S9A is added to the processing of steps S1 to S6 for implementing the substrate misalignment detection method. The device (controller 13) that implements the substrate position abnormality determination method is a substrate position abnormality determination device.

Further, the substrate transfer control method of the first embodiment is implemented by the processing in which the processing of steps S7 to S10B is added to the processing of steps S1 to S6 for implementing the substrate misalignment detection method. The device (controller 13) that implements the substrate transfer control method is a substrate transfer control device.

When the processing is started, the controller 13 moves the transfer arm 15 (see FIG. 1) and places the wafer W on the pins 19 in a state in which the pins 19 are caused to protrude by lowering the stage 18 from the position shown in FIG. 3A (step S1). In the state in which the wafer W is placed on the pins 19 in step S1, no misalignment occurs.

The controller 13 raises the stage 18 to set the height position of the upper surface thereof to Z=Z1 (see FIG. 3A), and sucks the wafer W with the vacuum chuck (step S2). When the height position of the upper surface of the stage 18 becomes Z=Z1, the pins 19 are accommodated in the stage 18, whereby the wafer W is placed on the upper surface of the stage 18 as shown in FIG. 3A. If the state of the vacuum chuck is switched to the suction state in this state, the wafer W can be held by suction at the correct position on the upper surface of the stage 18. Since the wafer W is merely placed on the three pins 19 in the state before the height position of the upper surface of the stage 18 reaches Z=Z1 by raising the stage 18 in step S2 after step S1, no misalignment occurs. When the height position of the upper surface of the stage 18 reaches Z=Z1, the wafer W placed on the pins 19 is held on the upper surface of the stage 18 rising from below, and is merely held by suction by the vacuum chuck at that position. Therefore, no misalignment occurs.

The controller 13 captures an image of the wafer W with the camera 21 (step S3). In step S3, there is obtained an image of the wafer W existing at the correct position when the height position of the upper surface of the stage 18 is Z=Z1. The height position (Z=Z1) of the upper surface of the stage 18 in step S3 is an example of a first height position. The image obtained in step S3 is an example of first image information. The camera 21 is an example of an information acquisition part.

The controller 13 switches the state of the vacuum chuck to the non-suction state, and then lowers the stage 18 (step S4). In step S4, the stage 18 is lowered until the height position of the upper surface of the stage 18 reaches the position of Z=Z2, which is lower than Z=Z1.

When the stage 18 is lowered in step S4, the pins 19 protrude from the upper surface of the stage 18 as shown in FIG. 3B, and the wafer W is held at the position of Z=Z1 by the three pins 19. That is, the wafer W is held by the pins 19 at the position of Z=Z1, which is an example of a first height position. As described above, there is a possibility that misalignment may occur when the state of the vacuum chuck is switched to the non-suction state and when wafer W is transferred from the stage 18 to the pins 19.

The controller 13 captures an image of the wafer W with the camera 21 (step S5). In step S5, there is obtained an image of the wafer W held by the pins 19 at a height position of Z=Z1. The image obtained in step S5 is an example of second image information.

The controller 13 obtains a difference D between the images obtained in steps S3 and S5 (step S6). For example, when misalignment occurs, the difference D as shown in FIG. 4C is obtained. If there is no misalignment, the difference D becomes zero.

The controller 13 determines whether or not the misalignment represented by the difference D is abnormal (step S7). The controller 13 stores a first threshold value for determination in step S7 in an internal memory. In step S7, whether or not the misalignment represented by the difference D is abnormal may be determined by determining whether or not the misalignment represented by the difference D is equal to or greater than the first threshold value. The first threshold value includes a threshold value in the X direction and a threshold value in the Y direction.

Since the misalignment in which the wafer W is tilted obliquely is abnormal, if the data including a threshold value of a color tone difference for each pixel is used as the first threshold value, the misalignment in which the wafer W is tilted obliquely may be determined to be abnormal in step S7.

When it is determined that the misalignment represented by the difference D is abnormal (S7: YES), the controller 13 determines whether or not the misalignment is correctable (step S8). The correctable misalignment means a relatively slight misalignment that can be corrected by the pre-alignment device 15A.

The controller 13 stores a second threshold value for determination in step S8 in the internal memory. In step S8, whether or not the misalignment is correctable may be determined by determining whether or not the misalignment represented by the difference D is equal to or less than the second threshold value. The second threshold value is smaller than the first threshold value used in step S7. Further, the second threshold value includes a threshold value in the X direction and a threshold value in the Y direction.

If the wafer W is tilted obliquely, the misalignment cannot be corrected. Therefore, if the data including a threshold value of a color tone difference for each pixel is used as the second threshold value, the misalignment in which the wafer W is tilted obliquely may be determined not to be correctable in step S8.

When it is determined that the misalignment is not correctable (S8: NO), the controller 13 issues an alert (step S9A). The alert issuance is an example of abnormality notification, and may be performed, for example, by displaying data, which indicates that uncorrectable misalignment has occurred, on the display device 14. Information that identifies the wafer W, such as the lot number or the like, may be displayed at the same time. In addition to the display on the display device 14, or instead of the display on the display device 14, an alert may be issued by voice or the like.

The uncorrectable misalignment refers to misalignment when the planar misalignment of the wafer W is equal to or greater than the first threshold value and when the wafer W is tilted obliquely.

Further, when it is determined in step S8 that the misalignment is correctable (S8: YES), the controller 13 drives the transfer arm 15 so that the wafer W held on the pins 19 is received by the transfer arm 15 and placed on a rotatable body of the pre-alignment device 15A. Then, the pre-alignment device 15A is driven to correct the misalignment (step S9B).

After completing the processing of step S9B, the controller 13 operates the transfer arm 15 to unload the inspected wafer W from the prober room 12 to a predetermined unloading position (step S10A). For example, the wafer W unloaded from the prober room 12 is stored in an FOUP or the like. The FOUP or the like is an example of a storage part.

Further, when it is determined in step S7 that the misalignment represented by the difference D is not abnormal (S7: NO), the controller 13 operates the transfer arm 15 so that the inspected wafer W held on the pins 19 is received by the transfer arm 15 and unloaded from the prober room 12 to a predetermined unloading position (step S10B).

When the processing of steps S9A, S10A or S10B is completed, the controller 13 terminates a series of processing.

In this regard, when it is determined in step S7 that the misalignment represented by the difference D is abnormal (S7: YES), the controller 13 may proceed to step S9A and may issue an alert while bypassing the processing of step S8.

As described above, according to the substrate misalignment detection method of the first embodiment, in the state in which the wafer W is placed at the correct position on the upper surface of the stage 18 and held by suction by the vacuum chuck and in the state in which the state of the vacuum chuck is subsequently switched to the non-suction state and the wafer W is held by the pins 19, the height positions of the wafer W are made equal, the images of the wafer W are captured by the camera 21, and the misalignment of the wafer W is detected based on the difference D between the two images.

Therefore, it is possible to detect the misalignment of the wafer W occurring in two situations, i.e., a situation where the wafer W is placed on the upper surface of the stage 18 and the state of the vacuum chuck is switched from the suction state to the non-suction state and a situation where the state of the wafer W is switched from a state in which the wafer W is placed on the stage 18 without being held by suction to a state in which the wafer W is held by the pins 19. These two situations occur in a state in which the wafer W is not held by suction to the stage 18 by the vacuum chuck.

Therefore, it is possible to provide a substrate misalignment detection method capable of accurately detecting the misalignment that occurs in a state in which the wafer W is not held by suction to the stage 18. Further, since it is possible to accurately detect the misalignment that occurs in a state in which the wafer W is not held by suction to the stage 18, the inspection of the electrical characteristics can be stably executed and the inspection can be performed with high throughput.

Further, according to the substrate position abnormality determination method of the first embodiment, in addition to the processing of the substrate misalignment detection method, it is further determined whether or not the misalignment represented by the difference D is abnormal. Therefore, it is possible to provide a substrate position abnormality determination method capable of accurately determining whether or not the misalignment occurring when the wafer W is not held by suction to the stage 18 is abnormal.

Further, according to the substrate transfer control method of the first embodiment, in addition to the processing of the substrate position abnormality determination method, when the misalignment of the wafer W is not an abnormality, the wafer W is transferred to the unloading position and stored in the FOUP or the like. Therefore, it is possible to provide a substrate transfer control method capable of storing the wafer W in the FOUP (Front Opening Unified Pod) or the like when it is accurately determined that the misalignment occurring when the wafer W is not held by suction to the stage 18 is not an abnormality.

Although the aspect in which the stage 18 sucks the wafer W with the vacuum chuck has been described above, an electrostatic chuck may be used instead of the vacuum chuck. Further, even when a chuck other than the vacuum chuck, such as an electrostatic chuck or the like, is used, it is possible to obtain the same effects as the effects described in the case of using the vacuum chuck.

Further, instead of acquiring images by capturing images with the camera 21, the positions of the wafer W may be directly obtained, and the difference between the positions of the wafer W in the two states as shown in FIGS. 3A and 3B may be obtained to thereby detect misalignment. The information representing the positions of the wafer W obtained in the two states shown in FIGS. 3A and 3B is an example of first position information and second position information, respectively. The device that directly obtains the positions of the wafer W may be any device capable of directly obtaining positions, such as a position sensor using an infrared laser or the like.

Further, although the inspection device 10 has been described above, the substrate misalignment detection method, the substrate position abnormality determination method, the substrate transfer control method and the substrate misalignment detection device of the first embodiment are not limited to the inspection device 10 but may also be applicable to a film forming apparatus, an etching apparatus or the like.

Second Embodiment

FIGS. 6A and 6B are diagrams showing examples of a positional relationship between a stage 18 and pins 19 when an image of a wafer W is acquired in a second embodiment. The height positions of the wafer W when acquiring the two images in the second embodiment are different from those in the first embodiment. Furthermore, FIG. 6B shows a transfer arm 15. Since respective components shown in FIGS. 6A and 6B are the same as those of the first embodiment, the same components will be designated by the same reference numerals with the description thereof omitted.

In the second embodiment, in the states shown in FIGS. 6A and 6B, images are acquired by the camera 21 with the lower surface of the wafer W kept at the position of Z=Z3 (mm). Z3 is a higher position than Z1 of the first embodiment (Z3>Z1). In FIG. 6A, the upper surface of the stage 18 is kept at the position of Z=Z3.

In FIG. 6A, the wafer W is held by suction to the upper surface of the stage 18 by the vacuum chuck. In this state, the wafer W is transferred by the transfer arm 15 (see FIG. 1) and is accurately placed at the correct position on the upper surface of the stage 18. The height position of the upper surface of the stage 18 is Z=Z3. In order to set the height position of the upper surface of the stage 18 to Z=Z3, the stage 18 is raised by the elevating mechanism 17A from the height position of Z=Z1.

The height position of Z=Z3 is, for example, a height position available when the transfer arm 15 transfers the wafer W after the inspection of the electrical characteristics is completed. Therefore, after the state of the vacuum chuck is switched to the non-suction state in the state shown in FIG. 6A, the stage 18 is lowered by the elevating mechanism 17A. In the state in which the wafer W is held by the pins 19 as shown in FIG. 3B of the first embodiment, the transfer arm 15 receives the wafer. The state in which the transfer arm 15 that has received the wafer W is raised to a position where the height position of the lower surface of the wafer W is Z=Z3 is the state shown in FIG. 6B.

In the second embodiment, in a state in which the wafer W is held by suction to the upper surface of the stage 18 as shown in FIG. 6A and the height position of the upper surface of the stage 18 is Z=Z3 and in a state in which the transfer arm 15 that has received the wafer W is raised so that the height position of the lower surface of the wafer W is Z=Z3, images of the wafer W are acquired by the camera 21.

Then, as in the first embodiment, a difference D between the two images is obtained to detect the misalignment of the wafer W or to determine the abnormality of the misalignment.

In the first embodiment, there has been described the aspect of detecting the misalignment of the wafer W that occurs in the situation where the wafer W is placed on the upper surface of the stage 18 and the state of the vacuum chuck is switched from the suction state to the non-suction state and in the situation where the state of the wafer W is switched from a state in which the wafer W is placed on the stage 18 without being held by suction to a state in which the wafer W is held by the pins 19.

In the second embodiment, in addition to the misalignment that may occur in these two situation, there is detected the misalignment that occurs in a situation where the transfer arm 15 receives the wafer W held by the pins 19 and in a situation where the transfer arm 15 moves upward. When the transfer arm 15 has a chuck such as a vacuum chuck or the like, misalignment does not occur in the situation where the transfer arm 15 moves upward. When the transfer arm 15 has a chuck, there may be an aspect in which the wafer W is placed on and held by suction by the transfer arm 15 and an aspect in which the transfer arm 15 sucks the wafer W from above.

The height position of the upper surface of the stage 18 shown in FIG. 6A is equal to the height position of the lower surface of the wafer W (Z=Z3), and is an example of a first height position. Furthermore, as shown in FIG. 6B, just like FIG. 3B of the first embodiment, the height position of the upper surface of the stage 18 which is lowered in order to transfer the wafer W to the pins 19 (Z=Z2) is an example of a second height position. Since the height position of the upper surface of the transfer arm 15 shown in FIG. 6B is equal to the height position of the upper surface of the stage 18 shown in FIG. 6A, it is an example of the first height position.

In the situation where the transfer arm 15 receives the wafer W held by the pins 19, there is a possibility that when the wafer W is delivered to the transfer arm 15, misalignment may occur due to the deviation of a relative position between the pins 19 and the transfer arm 15. Further, in the situation where the transfer arm 15 moves upward, if the transfer arm 15 does not suck the wafer W by the vacuum chuck or the like, the wafer W is not fixed to the transfer arm 15. Therefore, there is a possibility that misalignment may occur.

FIG. 7 is a flowchart showing an example of the processing performed by a substrate misalignment detection method, a substrate position abnormality determination method and a substrate transfer control method according to the second embodiment. The processing shown in FIG. 7 is executed by the controller 13.

The processing of steps S1, S3, S4, S5 to S8 and S9A among steps S1 to 10C shown in FIG. 7 is the same as the processing of the same step numbers in the first embodiment. The processing of the second embodiment includes steps S2A, S9C and S10C instead of steps S2, S9B and S10A of the first embodiment, respectively, and includes step S4A provided between steps S4 and S5. Further, in the second embodiment, when NO is determined in step S7, the flow is caused to proceed to step S10C, and the processing of step S10B of the first embodiment is not performed. Hereinafter, differences from the processing of the first embodiment will be described.

The substrate misalignment detection method of the second embodiment is implemented by the processing of steps S1 to S6 among steps S1 to S10C described below. Further, the device (controller 13) that implements the substrate misalignment detection method is a substrate misalignment detection device.

Further, the substrate position abnormality determination method of the second embodiment is implemented by the processing in which the processing of step S7 or the processing of steps S7 and S9A is added to the processing of steps S1 to S6 for implementing the substrate misalignment detection method. The device (controller 13) that implements the substrate position abnormality determination method is a substrate position abnormality determination device.

Further, the substrate transfer control method of the second embodiment is implemented by the processing in which the processing of steps S7 to S10C is added to the processing of steps S1 to S6 for implementing the substrate misalignment detection method. The device (controller 13) that implements the substrate transfer control method is a substrate transfer control device.

When the processing of step S1 is completed, the controller 13 raises the stage 18 so that the wafer W is placed on the upper surface thereof. In this state, the wafer W is held by suction by the vacuum chuck, and the stage 18 is raised until the height position of the upper surface thereof becomes Z=Z3 (step S2A). When the height position of the upper surface of the stage 18 becomes Z=Z1, the pins 19 are accommodated in the stage 18 so that the wafer W is placed on the upper surface of the stage 18. If the state of the vacuum chuck is switched to the suction state in this state, the wafer W can be held by suction at the correct position on the upper surface of the stage 18. Then, in the state in which the wafer W is held by suction at the correct position on the upper surface of the stage 18, the stage 18 may be raised until the height position of the upper surface thereof becomes Z=Z3 as shown in FIG. 6A. After the stage 18 is raised until the height position of the upper surface of the stage 18 becomes Z=Z3, the state of the vacuum chuck may be switched to the suction state.

When the processing of step S2A is completed, the controller 13 performs the processing of steps S3 and S4.

When the processing of step S4 is completed, the controller 13 drives the transfer arm 15 to receive the wafer W held by the pins 19, and raises the transfer arm 15 to the height position of Z=Z3 (step S4A).

When the processing of step S4A is completed, the controller 13 performs the processing of step S5 and subsequent steps. The processing of steps S5 to S8 is the same as that of the first embodiment.

The flow proceeds to step S9A in the case where uncorrectable misalignment has occurred. Therefore, the controller 13 issues an alert (step S9A). As a result, for example, data or the like indicating that uncorrectable misalignment has occurred is displayed on the display device 14.

The uncorrectable misalignment is misalignment available when the planar misalignment of the wafer W is equal to or greater than the first threshold value and when the wafer W is tilted obliquely.

Further, the flow proceeds to step S9C in the case where correctable misalignment occurs. Therefore, the controller 13 drives the transfer arm 15 to place the wafer W on the rotatable body of the pre-alignment device 15A. The controller 13 drives the pre-alignment device 15A to correct the misalignment (step S9C).

Next, the controller 13 drives the transfer arm 15 to unload the inspected wafer W from the prober room 12 to a predetermined unloading position (step S10C).

Further, the controller 13 also performs the processing of step S10C even when it is determined in step S7 that the misalignment represented by the difference D is not abnormal (S7: NO). The controller 13 drives the transfer arm 15 to unload the inspected wafer from the prober room 12 to the predetermined unloading position.

As described above, according to the substrate misalignment detection method of the second embodiment, in the state in which the wafer W is placed at the correct position on the upper surface of the stage 18 and held by suction by the vacuum chuck and in the state in which the transfer arm 15 subsequently holds the wafer W, the height positions of the wafer W are made equal, the images of the wafer W are captured by the camera 21, and the misalignment of the wafer W is detected based on the difference D between the two images. Between these two states, there are the situation where the wafer W is placed on the upper surface of the stage 18 and the state of the vacuum chuck is switched from the suction state to the non-suction state and the situation where the state of the wafer W is switched from a state in which the wafer W is placed on the stage 18 without being held by suction to a state in which the wafer W is held by the pins 19. In addition, there are present the situation where the transfer arm 15 receives the wafer W held by the pins 19 and the situation where the transfer arm 15 moves upward.

Therefore, after going through the four situations described above, the misalignment of the wafer W can be detected in the state in which the wafer W is held by the transfer arm 15 as shown in FIG. 6B. All of these four situations occur in a state in which the wafer W is not held by suction to the stage 18 by the vacuum chuck.

Therefore, it is possible to provide a substrate misalignment detection method capable of accurately detecting the misalignment that occurs in a state in which the wafer W is not held by suction to the stage 18. Further, since it is possible to accurately detect the misalignment that occurs in a state in which the wafer W is not held by suction to the stage 18, the inspection of the electrical characteristics can be stably executed and the inspection can be performed with high throughput.

Further, according to the substrate position abnormality determination method of the second embodiment, in addition to the processing of the substrate misalignment detection method, it is further determined whether or not the misalignment represented by the difference D is abnormal. Therefore, it is possible to provide a substrate position abnormality determination method capable of accurately determining whether or not the misalignment occurring when the wafer W is not held by suction to the stage 18 is abnormal.

Further, according to the substrate transfer control method of the second embodiment, in addition to the processing of the substrate position abnormality determination method, when the misalignment of the wafer W is not an abnormality, the wafer W is transferred to the unloading position and stored in the FOUP or the like. Therefore, it is possible to provide a substrate transfer control method capable of storing the wafer W in the FOUP or the like when it is accurately determined that the misalignment occurring when the wafer W is not held by suction to the stage 18 is not an abnormality.

Although the aspect in which the stage 18 sucks the wafer W with the vacuum chuck has been described above, just like the first embodiment, an electrostatic chuck may be used instead of the vacuum chuck. Further, even when a chuck other than the vacuum chuck, such as an electrostatic chuck or the like, is used, it is possible to obtain the same effects as the effects described in the case of using the vacuum chuck.

Further, as in the first embodiment, a device for directly determining the position of the wafer W may be used instead of the camera 21.

Further, as in the first embodiment, the substrate misalignment detection method, the substrate position abnormality determination method, the substrate transfer control method and the substrate misalignment detection device of the second embodiment are not limited to the inspection device 10 but may also be applicable to a film forming apparatus, an etching apparatus or the like.

According to the present disclosure in some embodiments, it is possible to accurately detect the misalignment of the substrate that occurs in a state in which the substrate is not held by suction to the stage.

Although the embodiments of the substrate misalignment detection method, the substrate position abnormality determination method, the substrate transfer control method and the substrate misalignment detection device according to the present disclosure have been described above, the present disclosure is not limited to the above-described embodiments. Various changes, modifications, replacements, additions, deletions and combinations may be made within the scope of the claims. These also belong to the technical scope of the present disclosure.

What is claimed is:

1. A substrate misalignment detection method, comprising:
    acquiring first image information or first position information of a substrate held to a stage by suction at a first height position;
    delivering the substrate from the stage to a holder in a state in which the suction of the substrate is released and causing the holder to hold the substrate at the first height position;
    acquiring second image information or second position information of the substrate held at the first height position; and
    detecting misalignment of the substrate by comparing the first image information with the second image information or by comparing the first position information with the second position information.

2. The substrate misalignment detection method of claim 1, further comprising:
    raising the stage on which the substrate is placed and moving the stage to the first height position,
    wherein the acquiring the first image information or the first position information of the substrate includes acquiring the first image information or the first position information of the substrate placed on and held by suction to the stage moved to the first height position.

3. The substrate misalignment detection method of claim 2, wherein the delivering the substrate from the stage to the holder in the state in which the suction of the substrate is released and causing the holder to hold the substrate at the first height position includes lowering the stage to a second height portion lower than the first height position in the state in which the suction of the substrate is released, and causing the holder to hold the substrate at the first height position.

4. The substrate misalignment detection method of claim 1, wherein the delivering the substrate from the stage to the holder in the state in which the suction of the substrate is released and causing the holder to hold the substrate at the first height position includes lowering the stage to a second height portion lower than the first height position in the state in which the suction of the substrate is released, and causing the holder to hold the substrate at the first height position.

5. A substrate position abnormality determination method, comprising:
    the substrate misalignment detection method of claim 1; and
    determining whether or not the position of the substrate is abnormal based on the misalignment of the substrate.

6. The substrate position abnormality determination method of claim 5, further comprising:
    determining whether or not the position of the substrate is correctable, when the position of the substrate is determined to be abnormal in the determining whether or not the position of the substrate is abnormal; and
    notifying that the position of the substrate is abnormal, when the position of the substrate is determined to be uncorrectable in the determining whether or not the position of the substrate is correctable.

7. A substrate transfer control method, comprising:
    the substrate position abnormality determination method of claim 5;
    receiving, by a transfer mechanism, the substrate held by the holder, when the position of the substrate is determined to be correctable in the determining whether or not the position of the substrate is correctable;
    correcting, by a correction device, the misalignment of the substrate received by the transfer mechanism; and
    storing, by the transfer mechanism, the substrate having the corrected misalignment in a storage part.

8. A substrate transfer control method, comprising:
    the substrate position abnormality determination method of claim 5;
    receiving, by a transfer mechanism, the substrate held by the holder, when the position of the substrate is determined not to be abnormal in the determining whether or not the position of the substrate is abnormal; and
    storing the substrate received by the transfer mechanism in a storage part.

9. A substrate misalignment detection method, comprising:
    acquiring first image information or first position information of a substrate held to a stage by suction at a first height position;
    delivering the substrate from the stage to a holder in a state in which the suction of the substrate is released, and causing the holder to hold the substrate;
    receiving, by a transfer mechanism, the substrate held by the holder;
    acquiring second image information or second position information of the substrate held at the first height position by the transfer mechanism; and
    detecting misalignment of the substrate by comparing the first image information with the second image information or by comparing the first position information with the second position information.

10. The substrate misalignment detection method of claim 9, further comprising:
    raising the stage on which the substrate is placed and moving the stage to the first height position,
    wherein the acquiring the first image information or the first position information of the substrate includes acquiring the first image information or the first position information of the substrate placed on and held by suction to the stage moved to the first height position.

11. The substrate misalignment detection method of claim 10, wherein the delivering the substrate from the stage to the holder in the state in which the suction of the substrate is released and causing the holder to hold the substrate includes lowering the stage to a second height portion lower than the first height position in the state in which the suction of the substrate is released, and causing the holder to hold the substrate.

12. The substrate misalignment detection method of claim 9, wherein the delivering the substrate from the stage to the holder in the state in which the suction of the substrate is released and causing the holder to hold the substrate includes lowering the stage to a second height portion lower than the first height position in the state in which the suction of the substrate is released, and causing the holder to hold the substrate.

13. A substrate position abnormality determination method, comprising:
the substrate misalignment detection method of claim 9; and
determining whether or not the position of the substrate is abnormal based on the misalignment of the substrate.

14. The substrate position abnormality determination method of claim 13, further comprising:
determining whether or not the position of the substrate is correctable, when the position of the substrate is determined to be abnormal in the determining whether or not the position of the substrate is abnormal; and
notifying that the position of the substrate is abnormal, when the position of the substrate is determined to be uncorrectable in the determining whether or not the position of the substrate is correctable.

15. A substrate transfer control method, comprising:
the substrate position abnormality determination method of claim 13;
correcting, by a correction device, the misalignment of the substrate received by the transfer mechanism, when the position of the substrate is determined to be correctable in the determining whether or not the position of the substrate is correctable; and
storing, by the transfer mechanism, the substrate having the corrected misalignment in a storage part.

16. A substrate transfer control method, comprising:
the substrate position abnormality determination method of claim 13; and
storing, by the transfer mechanism, the substrate in a storage part, when the position of the substrate is determined not to be abnormal in the determining whether or not the position of the substrate is abnormal.

17. A substrate misalignment detection device that detects misalignment of a substrate based on image information or position information of the substrate acquired by an information acquisition part that acquires the image information or the position information of the substrate,
wherein the substrate misalignment detection device is configured to execute processing that includes:
acquiring first image information or first position information of the substrate held to a stage by suction at a first height position;
delivering the substrate from the stage to a holder in a state in which the suction of the substrate is released, and causing the holder to hold the substrate at the first height position;
acquiring second image information or second position information of the substrate held at the first height position by the holder; and
detecting the misalignment of the substrate by comparing the first image information with the second image information or by comparing the first position information with the second position information.

18. A substrate misalignment detection device that detects misalignment of a substrate based on image information or position information of the substrate acquired by an information acquisition part that acquires the image information or the position information of the substrate,
wherein the substrate misalignment detection device is configured to execute processing that includes:
acquiring first image information or first position information of the substrate held to a stage by suction at a first height position;
delivering the substrate from the stage to a holder in a state in which the suction of the substrate is released, and causing the holder to hold the substrate;
receiving, by a transfer mechanism, the substrate held by the holder;
acquiring second image information or second position information of the substrate held at the first height position by the transfer mechanism; and
detecting the misalignment of the substrate by comparing the first image information with the second image information or by comparing the first position information with the second position information.

* * * * *